(12) United States Patent
Yang et al.

(10) Patent No.: US 8,421,456 B2
(45) Date of Patent: Apr. 16, 2013

(54) METHOD OF TIME-DOMAIN MAGNETIC RESONANCE IMAGING AND DEVICE THEREOF

(75) Inventors: Shan-Yung Yang, Chung-He (TW); Jean-Fu Kiang, Taipei (TW)

(73) Assignee: National Taiwan University, Taipei (TW)

( * ) Notice: Subject to any disclaimer, the term of this patent is extended or adjusted under 35 U.S.C. 154(b) by 488 days.

(21) Appl. No.: 12/511,404

(22) Filed: Jul. 29, 2009

(65) Prior Publication Data

US 2010/0182006 A1 Jul. 22, 2010

(30) Foreign Application Priority Data

Jan. 17, 2009 (TW) ................................ 98101851 A

(51) Int. Cl.
*G01V 3/00* (2006.01)
(52) U.S. Cl.
USPC .......................................... 324/309; 324/307
(58) Field of Classification Search .................. 324/309, 324/307, 300
See application file for complete search history.

(56) References Cited

U.S. PATENT DOCUMENTS

| 4,354,499 | A | * | 10/1982 | Damadian | 600/410 |
| 5,051,698 | A | * | 9/1991 | Ordidge | 324/309 |
| 5,347,217 | A | * | 9/1994 | Leach et al. | 324/309 |
| 6,087,831 | A | * | 7/2000 | Bornert et al. | 324/307 |
| 7,126,332 | B2 | * | 10/2006 | Blanz et al. | 324/303 |
| 7,253,619 | B2 | * | 8/2007 | Weiland | 324/307 |

* cited by examiner

*Primary Examiner* — Louis Arana
(74) *Attorney, Agent, or Firm* — Allen, Dyer, Doppelt, Milbrath & Gilchrist, P.A.

(57) ABSTRACT

The present invention relates to a method of time-domain magnetic resonance imaging and device thereof. The method includes transiently exciting a sample; receiving a signal emitted form the sample; and processing the received signal without Fourier transformation to acquire an image. The device includes an excitation device, a detecting coil and an operating circuit to process a received emitting signal and generating an image, wherein the received emitting signal is a time-domain signal free from Fourier transformation. The time of generating an image can be reduced dramatically by the present invention.

18 Claims, 6 Drawing Sheets

METHOD OF TIME-DOMAIN MAGNETIC RESONANCE IMAGING AND DEVICE THEREOF

FIELD OF THE INVENTION

The present invention relates to a method of time-domain magnetic resonance imaging and a device thereof and more particularly relates to a method and a device to process a received signal emitted by a sample without Fourier transformation to acquire an image data.

BACKGROUND OF THE INVENTION

In today's clinical MRI, intensity of the main magnetic field ranges from 1 to 3 T, the number of voxels in one direction ranges from 128 to 512, and the image resolution is about 1-5 mm. The SNR is not a constant in different test samples even if the experimental setups are the same. A referred SNR in a 7 T MRI apparatus ranges from 20 to 40.

Nowadays, MRI is primarily used to display high-quality diagnostic images of human organs. Typical MR signals of clinic MRI fall in the radio-frequency range, and no ionizing radiation and associated hazards are expected. The spatial resolution of MRI is determined by the magnitude of the three gradient fields in three perpendicular directions. In general, the MR signals depend on the intrinsic parameters of the sample, including magnetization density M, spin-lattice relaxation time $T_1$, spin-spin relaxation time $T_2$, molecular diffusion and perfusion, susceptibility effects, chemical shift differences, and so on. The effects of these parameters on images can be suppressed or enhanced by adjusting certain operating parameters, such as repetition time $T_R$, echo time $T_E$, and flip angle. An MRI can display the spatial distribution of stationary magnetization density, relaxation times, fluid diffusion coefficients, and so on.

Prior to 1965, NMR spectrum was measured by observing the resonant absorption of RF radiation, either at fixed frequency while varying the main magnetic field (field-swept NMR), or at fixed main magnetic field while varying the frequency of excitation field (frequency-swept NMR). In 1965, Richard Ernst and Weston Anderson proposed an approach to measure the NMR spectrum by taking the Fourier transform on the measured free induction decay (FID) signal. In 1973, P. C. Lauterbur proposed the first MRI which is also Fourier based. Since the advent of Fourier-based NMR in 1965 and MRI in 1973, only Fourier-based techniques were proposed, possibly due to inheritance.

The prior MRI technology also well-known as Fourier domain MRI technology or frequency domain MRI technology is to detect the amplitude of the signal which is irrelevant to time. The Fourier MRI needs three gradient fields in three perpendicular directions. When the three gradient fields are set up, a specific voxel in a sample will resonate at a specific frequency. In addition, an ac excitation field is used to nutate the voxels which resonate at the same frequency. After the excitation field is turned off, the magnetization in the nutated voxel begins to relax and causes magnetic flux change which induces an FID signal in the detecting coil. The FID signal associated with the specific voxel is used for measurement or imaging.

Although the prior MRI technology is widely used in many fields, there are still many outstanding problems as follow. (1) The scan time for a slice composed of 512×300 voxels using the prior MRI is too long to acquire a precise imaging (about 2-3 minutes). (2) The circuitry of the prior MRI is too complicated due to repeating switching on/off of the three gradient fields to get a proper resonant frequency. Besides, the long scan time causes the precise imaging of moving animals and living organs (lungs, etc.) impossible. Hence, a transient imaging on a microsecond level is required to expand the application of MRI.

Therefore, it brings no delay to invent a method and a control device to circumvent all the above issues. In order to fulfill this need, the inventors have made an invent "METHOD OF TIME-DOMAIN MAGNETIC RESONANCE IMAGING AND DEVICE THEREOF." The summary of the present invention is described as follows.

SUMMARY OF THE INVENTION

The object of the present invention is to provide a method of time-domain magnetic resonance imaging and a device thereof. More particularly, it relates to a method and a device to process a received time-domain signal emitted by a sample, and acquire an image data without Fourier transformation. The main idea is to prestore a plurality of components of the time-domain signal respectively corresponding to a plurality of voxels of the sample by treating the time-domain signal as a linear superposition of these plurality of components. By the invention, the scan time would be reduced dramatically for acquiring a precise imaging and the circuitry of the device would be more simple and effective than a prior MRI device.

According to the first aspect of the present invention, a method of time-domain magnetic resonance imaging includes (a) providing a magnetic field a sample is placed therein; (b) imposing an excitation field to excite the sample, and then immediately removing the excitation field to make the sample emit a free induction decay (FID) signal; (c) receiving the FID signal which is a time-domain signal; and (d) processing the time-domain signal free from Fourier transformation to acquire an image data.

Preferably, the above method is provided, wherein the time-domain signal is generated from a region having a plurality of voxels located in the sample.

Preferably, the above method is provided, wherein the time-domain signal is used to derive a distribution of magnetization of the plurality of voxels.

Preferably, the above method is provided, wherein the step (d) further includes a step (d1) of deriving a plurality of components of the time-domain signal respectively emitted by the plurality of voxels by treating the time-domain signal as a linear superposition of the plurality of components.

Preferably, the above method is provided, wherein the step (d) further includes a step (d1) of deriving a plurality of components of the time-domain signal respectively emitted by the plurality of voxels by a solution to the Bloch equation.

Preferably, the above method is provided, wherein the step (d) further includes a step (d1) of deriving a plurality of components of the time-domain signal respectively emitted by the plurality of voxels by a matrix operation.

Preferably, the above method is provided, wherein the step (a) further comprises a step (a1) of providing a gradient field in a direction being perpendicular to a direction of the excitation field and being the same as a direction of the magnetic field.

Preferably, the above method is provided, wherein the image data is acquired by processing the FID signal emitted once from the excited sample.

Preferably, the above method further comprises a step (e) of repeating the steps (b) and (c) to receive at least two FID signals for improving the signal-to-noise ratio (SNR) of the image data by averaging at least two FID signals.

Preferably, the above method is provided, wherein the step (a) further comprises a step (a1) of providing an auxiliary detecting coil to improve the resolution of the image data.

According to the second aspect of the present invention, a method of time-domain magnetic resonance imaging includes (a) providing a transient excitation to a sample to make the sample emit an emitting signal; (b) receiving the emitting signal which is a time-domain signal; and (c) processing the time-domain signal free from Fourier transformation to acquire an image data.

Preferably, the above method is provided, wherein the emitting signal is a free induction decay (FID) signal, the sample is placed in a magnetic field, and the step (d) further comprises a step (d1) of deriving a plurality of components of the time-domain signal respectively emitted by a plurality of voxels in the sample to acquire the image data by a method consisting of a solution to the Bloch equation, a matrix operation and by a treatment of the time-domain signal as a linear superposition of the plurality of components.

According to the third aspect of the present invention, an imaging device includes an excitation device transiently exciting a sample to emit an emitting signal; a detecting coil receiving the emitting signal; and an operating circuit processing the received emitting signal and acquiring an image of the sample, wherein the received emitting signal is a time-domain signal free from Fourier transformation.

Preferably, the above device is provided, wherein the image has a plurality of voxels respectively emitted by the plurality of magnetization densities and the operating circuit is an application specific integrated circuit (ASIC).

Preferably, the above device is provided, wherein the sample has a region having a plurality of voxels, the excitation device transiently excites the region to emit the emitting signal, the emitting signal is a free induction decay (FID) signal having a plurality of components respectively emitted by the plurality of voxels, the detecting coil receives the FID signal, the operating circuit is coupled to the detecting coil, and the image represents a plurality of magnetization densities respectively representing the plurality of components.

Preferably, the above device further includes two main coils providing a magnetic field, wherein the detecting coil and the excitation coil are configured between the two main coils, the detecting coil is configured inside the excitation coil, each of the coils has an axial direction, the axial directions of the two main coils are the same and perpendicular to the axial direction of the excitation coil, and the axial direction of the detecting coil is the same as the axial direction of the excitation coil.

Preferably, the above device further includes a gradient coil providing a gradient field and having an axial direction being the same as the axial direction of the main coil.

Preferably, the above device further includes an auxiliary detecting coil to improve the resolution of the image and having an axial direction being perpendicular to the axial direction of the detecting coil.

Preferably, the above device is provided, wherein the two main coils, the detecting coil, the excitation coil, the gradient coil and the auxiliary detecting coil are ones selected from a group consisting of a Golay coil, a Helmholtz coil and a solenoid coil, and are respectively made of a material selected from a group consisting of a conductive material, a semi-conductive material and a super-conductive material.

Preferably, the above device is provided, wherein the operating circuit derives the plurality of components based on a solution to the Bloch equation.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The main idea of the present invention is to detect a time-domain signal of a region having voxels and derive the distribution of magnetization of these voxels by using the time—domain signal. That is to say, by exciting the wholly sample or the slice of the sample once, i.e. receiving the signal once, the distribution of magnetization density of the sample or the slice can be derived. As a result, the scan time can be significantly reduced to a microsecond level.

Figure 1:
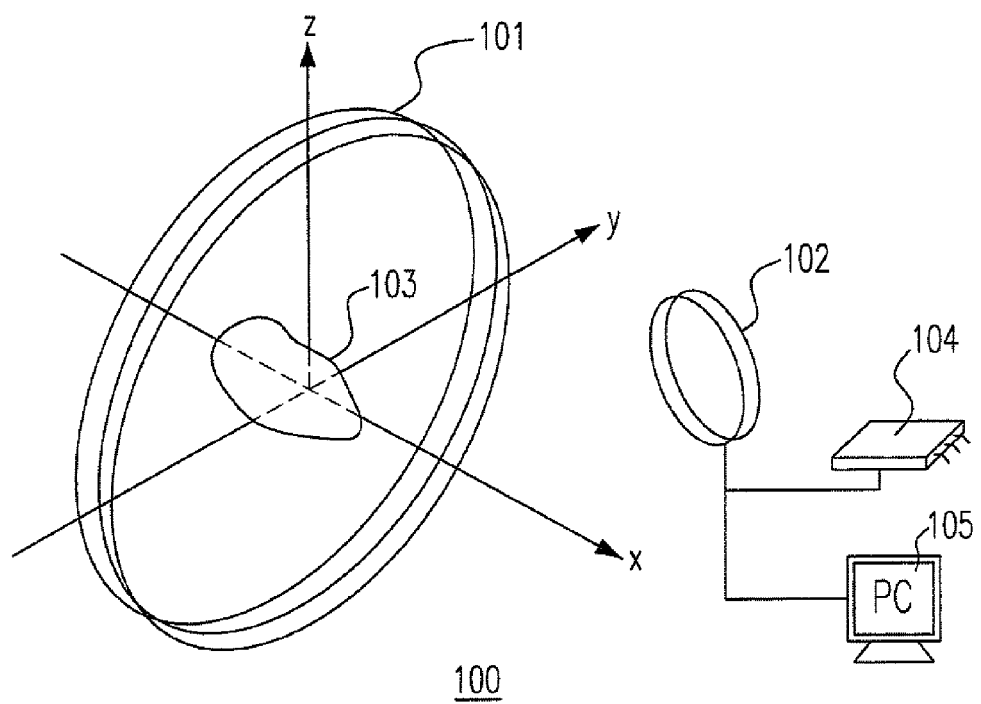
FIG. 1 shows a first preferred embodiment of the present invention.

Please refer to FIG. 1, which shows a first preferred embodiment of the present invention. The first preferred embodiment is a time-domain MRI device 100. This device 100 is configured with a main magnetic field pointing in the z direction and includes an excitation coil 101 with its axis pointing in the x direction for providing an excitation field and a detecting coil 102 pointing in a proper direction (such as y direction, etc.) coupled to an application specific integrated circuit 104 (ASIC) or a computer 105 for receiving a signal and processing the signal. Note that no gradient coils are required as in conventional Fourier-based MRI techniques, and only one set of gradient coils is sufficient to acquire the MRI of a slice of the sample 103.

The received time-domain signal of the present invention changes in amplitude with time and is processed by an algorithm. The processing is executed by the ASIC 104 or the computer 105 and the algorithm is based on the aforementioned method. In the circumstance of the first embodiment, noise in MRI originates from thermal perturbation of electrons within the sample 103 and the detecting coil 102. The root-mean-square (RMS) noise in MRI can be expressed as $$\sigma_n = \sqrt{4\kappa T R \Delta f} \quad (1)$$

where $\Delta f$ is the frequency encoding bandwidth and R is the equivalent resistance of sample 103. The Bloch equation can be expressed as $$\frac{d}{dt}\overline{M} = \gamma \overline{M} \times \overline{B}_T - \frac{\hat{x}M_x + \hat{y}M_y}{T_2} - \hat{z}\frac{M_z - M_z^0}{T_1} \quad (2)$$

where $\overline{M}(\overline{r}) = \hat{x}M_x + \hat{y}M_y + \hat{z}M_z$ is the magnetization density at $\overline{r}$, $\overline{B}_T$ is the total magnetic flux density exerted on $\overline{M}$, $T_1$ is the spin-lattice relaxation time, $T_2$ is the spin-spin relaxation time, and $M_z^0$ is the z component of $\overline{M}$ at equilibrium.

Closed-form solution to (2) is not generally available, but numerical method like Runge-Kutta method can be applied to obtain the numerical solution.

The magnetic flux flowing through the detecting coil 102 can be expressed as $$\Phi(t) = \iiint_{sample} \overline{\mathcal{B}}(\bar{r}) \cdot \overline{M}(\bar{r}, t) d\bar{r}$$

where $\overline{\mathcal{B}}(\bar{r})$ is the magnetic flux density at $\bar{r}$ generated by the same detecting coil 102 carrying 1 A of current. The voltage induced at the terminals of the detecting coil 102 can thus be expressed as $$V(t) = -\frac{\partial}{\partial t}\Phi(t) = -\frac{\partial}{\partial t}\iiint_{sample} \overline{\mathcal{B}}(\bar{r}) \cdot \overline{M}(\bar{r}, t) d\bar{r} \quad (3)$$

Let the sample 103 be divided into N small voxels of size $\Delta V$, then Eqn. (3) is discretized in+

$$V(t) \simeq -\frac{\partial}{\partial t}\sum_{n=1}^{N} \overline{\mathcal{B}}(\bar{r}_n) \cdot \overline{M}(\bar{r}_n, t)\Delta V \quad (4)$$

In conventional Fourier-based MRI techniques, typical spatial resolution is $\Delta V = 0.5 \times 0.5 \times 2$ mm³. Since Bloch equation is a linear equation of $\overline{M}$, superposition technique can be applied. First the time-varying magnetization density at $\bar{r}_n$ is expressed as $\overline{M}(\bar{r}_n,t) = M_n \overline{M}^1(\bar{r}_n,t)$, where $M_n$ is the initial magnetization density just before the excitation field is turned on at t=0, $\overline{M}^1(\bar{r}_n,t)$ is the transient response with initial condition $\overline{M}^1(\bar{r}_n,t=0)=\hat{z}$ A/m. Eqn. (4) is thus reduced to $$V(t) \simeq -\frac{\partial}{\partial t}\sum_{n=1}^{N} M_n \Delta V[\overline{\mathcal{B}}(\bar{r}_n) \cdot \overline{M}^1(\bar{r}_n, t)] = \sum_{n=1}^{N} \mathcal{M}_n v_n(t) \quad (5)$$

where $\mathcal{M}_n = M_n \Delta V$, and $$v_n(t) = -\overline{\mathcal{B}}(\bar{r}_n) \cdot \frac{\partial}{\partial t}\overline{M}^1(\bar{r}_n, t) \quad (6)$$

Define a cost function $$C(\mathcal{M}_1, \ldots, \mathcal{M}_N) = \int_{\tau_e}^{\tau_f}\left[V(t) - \sum_{n=1}^{N} \mathcal{M}_n v_n(t)\right]^2 dt$$

where V(t) is the voltage measured by the detecting coil, $\tau_e$ is the duration of the excitation pulse, and signal is received over $\tau_e \leq t \leq \tau_f$. The unknowns $\mathcal{M}_n$'s can be obtained by minimizing the cost function with respect to $\mathcal{M}_l$ as $$\frac{\partial C}{\partial \mathcal{M}_l} = \int_{\tau_e}^{\tau_f} \frac{\partial}{\partial \mathcal{M}_l}\left[V(t) - \sum_{n=1}^{N}\mathcal{M}_n v_n(t)\right]^2 dt = 0$$

$$1 \leq l \leq N$$

Thus, we have $$\sum_{n=1}^{N} \mathcal{M}_n \int_{\tau_e}^{\tau_f} v_l(t)v_n(t) dt = \int_{\tau_e}^{\tau_f} v_l(t)V(t) dt$$

$$1 \leq l \leq N$$

or in a matrix form $$\overline{\overline{Z}} \cdot \overline{\mathcal{M}} = \overline{\mathcal{V}} \quad (7)$$

where $$\overline{\mathcal{M}} = [\mathcal{M}_1, \ldots, \mathcal{M}_N]^t, \overline{\mathcal{V}} = [\mathcal{V}_1, \ldots, \mathcal{V}_N]^t,$$

and $$\overline{\overline{Z}} = \begin{bmatrix} Z_{11} & Z_{12} & \ldots & Z_{1N} \\ Z_{21} & Z_{22} & \ldots & Z_{2N} \\ \vdots & \vdots & \ddots & \vdots \\ Z_{N1} & Z_{N2} & \ldots & Z_{NN} \end{bmatrix}$$

with the elements $$Z_{ln} = \int_{\tau_e}^{\tau_f} v_l(t)v_n(t) dt \text{ and } \mathcal{V}_l = \int_{\tau_e}^{\tau_f} v_l(t)V(t) dt$$

Additional multiple detecting coils (auxiliary detecting coils) can be used to improve the condition of matrix $\overline{\overline{Z}}$. The magnetic flux density generated by the uth detecting coil carrying 1 A is denc $\overline{\mathcal{B}}^{(u)}(\overline{r})$ with $1 \leq u \leq D$ Similar to the derivation of (5), the voltage measured by the uth coil is $$V^{(u)}(t) \simeq \sum_{n=1}^{N} \mathcal{M}_n v_n^{(u)}(t)$$

where $$v_n^{(u)}(t) = -\overline{\mathcal{B}}^{(u)}(\bar{r}_n) \cdot \frac{\partial}{\partial t}\overline{M}^1(\bar{r}_n, t)$$

Following the same procedure, the same matrix form as in (7) is obtained, with the elements defined as $$Z_{ln} = \int_{\tau_e}^{\tau_f} \overline{v}_l^t(t) \cdot \overline{v}_n(t) dt \text{ and } \mathcal{V}_\ell = \int_{\tau_e}^{\tau_f} \overline{v}_l^t(t) \cdot \overline{V}(t) dt$$

where $$\overline{v}_l(t) = [v_l^{(1)}(t), v_l^{(2)}(t), \ldots, v_l^{(D)}(t)]^t$$

$$\overline{V}(t) = [V^{(1)}(t), V^{(2)}(t), \ldots, V^{(D)}(t)]^t$$

The sample 103 can be scanned in S slices by imposing a gradient field and adjusting the frequency of excitation current. Each slice is divided into $N_r$ rows by $N_c$ columns of voxels. Each time the excitation field is applied, FID signals from $N_r N_c$ resonant voxels in the selected slice will be received. If only the main magnetic field is provided without any gradient fields, signals from all the voxels in the sample will be received in one measurement. As a comparison, conventional Fourier-based techniques require three gradient fields and changing excitation frequency by the order of $N_r$ times to reconstruct the same slice image. The FID signals $\{\overline{v}_n(t)\}$ of unity magnetization density can be derived in advance and stored, so is the inverse of $\overline{\overline{Z}}$. To reconstruct MRI of a given slice or sample, simply take the inner product of $\{\overline{v}_\ell(t)\}$ with the measured FID signal $\overline{v}(t)$ to derive $\overline{v}$, then $\mathcal{M}$ of the given sample is determined as $\overline{\overline{Z}}^{-1} \cdot \overline{v}$.

The main magnetic field $\overline{B}_0(\overline{r})$ can be generated using permanent or inductive magnets. Permanent magnets are easy to be maintained, however, the field is more sensitive to temperature variation Inductive magnets or Helmholtz coils made of normal conductors are easy to be fabricated and maintained, however, ohmic loss in the conductor will create thermal noise. In clinic MRI, superconducting coils are commonly used to generate strong, homogeneous, and stable magnetic field, however, the cost of manufacturing and maintenance is high. Besides, the main coil, the detecting coil, the excitation coil, the gradient coil and the auxiliary detecting coil of the invention can be a Golay coil, a Helmholtz coil or a solenoid coil, and can be respectively made of a conductive material, a semi-conductive material or a super-conductive material.

Figure 2:
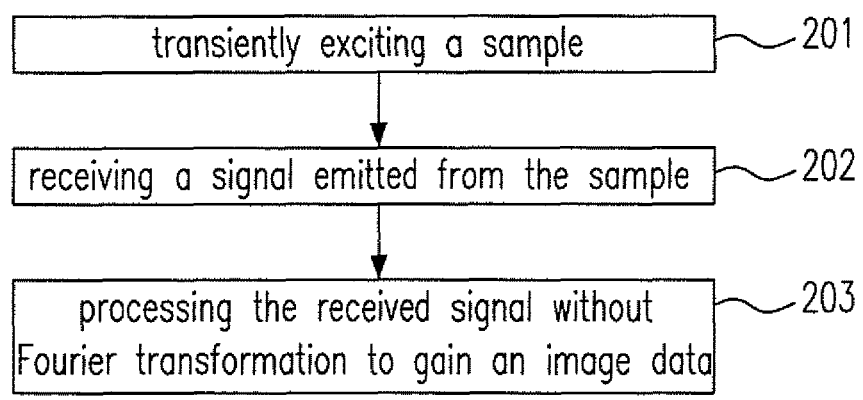
FIG. 2 shows a first flow chart of the method of the present invention.

Please refer to FIG. 2, which shows a first flow chart of the method of the present invention. The first flow chart of the method 200 commences with transiently exciting a sample 201 to make the sample emit a signal by imposing an excitation field and then immediately removing the excitation field or other ways (using an excitation device) to excite the sample. Afterwards, the signal from the sample is received 202 with a detecting coil or other receivers. Finally, the received signal without Fourier transformation is processed to acquire an image data 203. Besides, a magnetic field can also be provided, the signal emitted form the sample is an FID signal, and the received signal is a time-domain signal. The algorithm for processing the time-domain signal without Fourier transformation is to derive a distribution of magnetization of a plurality of voxels of the sample from the time-domain signal. That is to say, derive a plurality of components of the time-domain signal respectively emitted by the plurality of voxels by treating the time-domain signal as a linear superposition of the plurality of components. Note that a solution to the Bloch equation and a matrix operation can be applied in this algorithm.

An operating circuit such as ASIC and a computer can execute the algorithm to generate an image representing a plurality of magnetization densities respectively emitting the plurality of components of the time-domain signal. If a slice image is desired, an additional gradient field can be used to determine a slice of the sample to be excited and to emit a FID signal form the slice. In order to improve the signal-to-noise ratio (SNR) or the resolution of the image data, repeating a step of transiently exciting and receiving the FID signals at least two times and averaging the at least two FID signals can do the work. If there is only a detecting coil for receiving FID signals, these FID signals would be mixed and not distinguishable. The additional auxiliary detecting coils can be configured in different positions to receive the FID signals from the sample. These FID signals emitted form the same sample would be different because the positions are different so that the magnetization of voxels of the sample can be derived more precisely. If a larger slice of image is required, more auxiliary detecting coils are necessary to improve the resolution. In addition, the most important feature is that the present invention can generate an image data by one measurement to reduce the scan time dramatically.

Figure 3A:
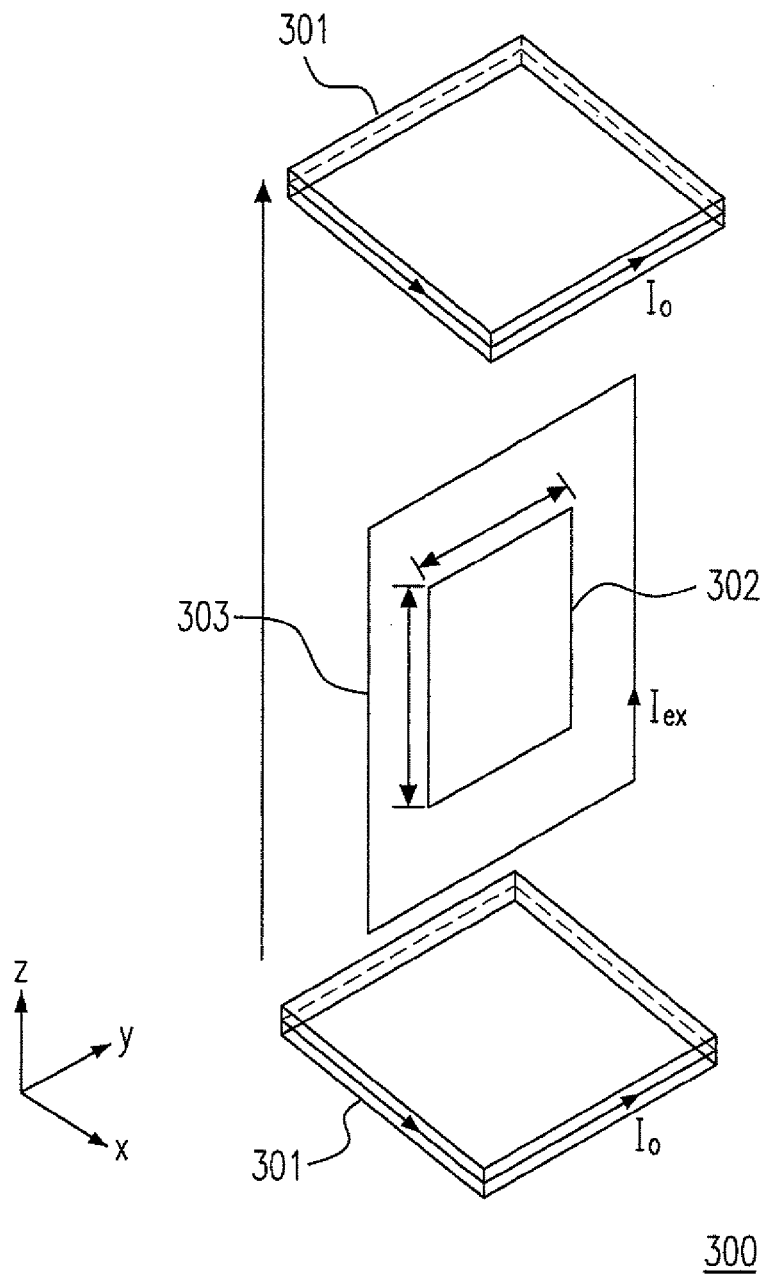
FIG. 3a shows a second preferred embodiment of the present invention.
Figure 3B:
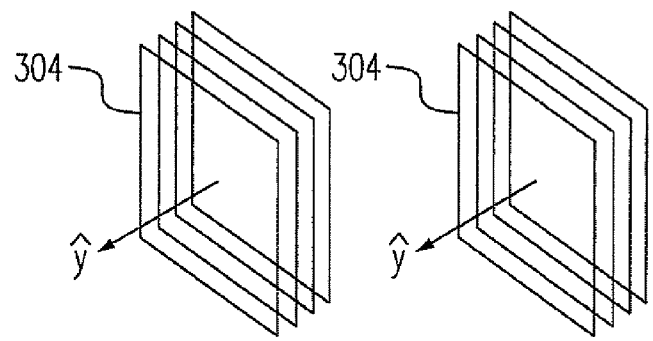
FIG. 3b shows a second preferred embodiment of the present invention (including auxiliary coils)
Figure 3B:
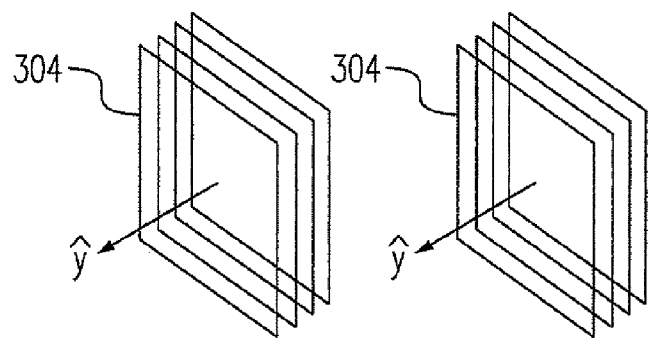
Figure 3C:
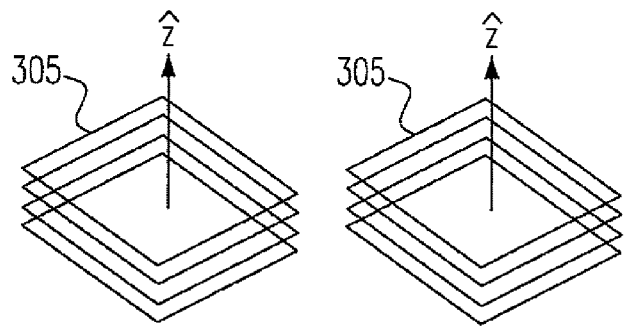
FIG. 3c shows second preferred embodiment of the present invention (including a gradient coil)
Figure 3C:
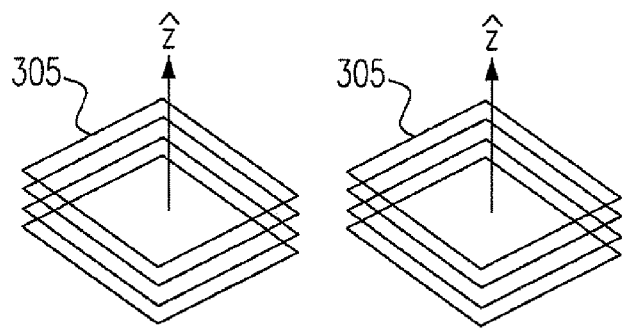

Please refer to FIGS. 3a, 3b and 3c, which show a second preferred embodiment of the present invention. The second preferred embodiment of the present invention is a time-domain MRI device 300. The device 300 includes at least two main coils 301 having an axial direction pointing in z direction to provide a main magnetic field, a detecting coil 302 having an axial direction pointing in x direction and connected to an ASIC or a computer to receive signals, an excitation coils 303 having an axial direction pointing in x direction to provide an excitation field, four auxiliary detecting coils 304 having an axial direction pointing in y direction to improve the condition of matrix $\overline{\overline{Z}}$, and four gradient coils 305 having an axial direction pointing in z direction and having the same current to provide a gradient field in x direction.

When the excitation current $$I_{ex}(t) = I_0^e(t) \cos \omega_0 t \tag{8}$$

is turned on, the magnetic field at the center of the excitation coil becomes $$\overline{B}_1(t) = \hat{x} 2 B_1^e(t) \cos \omega_0 t \tag{9}$$

The flip angle $\alpha$ of the magnetization vector driven by the excitation field is related to $B_1^e(t)$ as $$\alpha = \int_0^\infty \gamma B_1^e(t) dt$$

A pulse which flips the magnetization vector by an angle $\alpha$ is called an $\alpha$ pulse.

If $B_1^e(t)$ is chosen to be a sinc function, the frequency spectrum of $B_1(t)$ will be a square pulse centered at $\omega_0$, which can be used to select a slice with finite thickness in the spatial domain when a proper gradient field is imposed. The thickness of slice is proportional to the bandwidth of the square pulse in the frequency domain, and is inversely proportional to the pulse width of the sinc function in the time domain. Thus, to detect a thinner slice requires pulse with longer duration in the time domain. In practice, the sinc function is truncated and results in Gibbs's phenomenon. To reduce Gibbs's phenomenon, a short pulse in the time domain is preferred, but the resolvable slice thickness becomes larger.

The truncated sinc function can be expressed as $$B_1^e(t) = A_e \sin c[a(t - \tau_e/2)] \Pi(t/\tau_e)$$

where $\tau_e$ is the duration of the excitation pulse, $\Pi(t)$ is a pulse function which equals unity when $0 \leq t \leq 1$ and equals zero otherwise.

During $0 \leq t \leq \tau_e$, closed-form solution to Bloch equation in (2) is not available, and Runge-Kutta method can be applied to obtain a numerical solution. The time interval $0 \leq t \leq \tau_e$ is divided into small steps of $\Delta t = \tau_e/K$, with K large enough to guarantee convergence of the Runge-Kutta method over $0 \leq t \leq \tau_e$. By simulations, $K = 15 \, \omega_0/\pi$ turns out to render very accurate results.

Over $t \geq \tau_e$, (2) reduces to $$\frac{d}{dt} M_{xn} = \gamma B_{0n} M_{yn} - \frac{M_{xn}}{T_2} \tag{10}$$

$$\frac{d}{dt} M_{yn} = -\gamma B_{0n} M_{xn} - \frac{M_{yn}}{T_2}$$

$$\frac{d}{dt} M_{zn} = -\frac{M_{zn} - M_{zn}^0}{T_1}$$

where $M_{\beta n}=M_\beta(\bar{r}_n)$ with $\beta=x, y, z$, and $\bar{B}_{0n} \cong \hat{z} B_{0n}$ with $B_{0n}=B_0(\bar{r}_n)$. Note that the x and y components of $\bar{B}_{0n}$ are negligible. If an $\alpha$ pulse is applied to the sample, then the magnetization density at $t=\tau_e \ldots$ becomes $$M_{xn}(\tau_e)=M_{zn}^0 \sin\alpha \cos\phi_n$$

$$M_{yn}(\tau_e)=M_{zn}^0 \sin\alpha \cos\phi_n$$

$$M_{zn}(\tau_e)=M_{zn}^0 \cos\alpha$$

where $\{\phi_n\}$ characterize the dephasing phenomena of magnetization density at different voxels. The solution to (10) given the above initial conditions becomes $$M_{xn}(t)=M_{zn}^0 \sin\alpha e^{-t/T_2} \cos(\omega_{0n}t-\phi_n)$$

$$M_{yn}(t)=-M_{zn}^0 \sin\alpha e^{-t/T_2} \sin(\omega_{0n}t-\phi_n)$$

$$M_{zn}(t)=M_{zn}^0-M_{zn}^0(1-\cos\alpha)e^{-t/T_2}$$

where $\omega_{0n}=\gamma B_{0n}$.

The FID signal $v_n(t)$ as defined in (6) then becomes $$v_n(t) = -\mathcal{B}_{zn}\frac{M_{zn}^0(1-\cos\alpha)}{T_1}e^{-t/T_1} + \quad (11)$$

$$(\omega_{0n}T_2\mathcal{B}_{yn}+\mathcal{B}_{xn})\frac{M_{zn}^0 \sin\alpha}{T_2}e^{-t/T_2}\cos(\omega_{0n}t-\phi_n)+$$

$$(\omega_{0n}T_2\mathcal{B}_{xn}-\mathcal{B}_{yn})\frac{M_{zn}^0 \sin\alpha}{T_2}e^{-t/T_2}\sin(\omega_{0n}t-\phi_n)$$

Since $B_{xn}$, $B_{yn}$ and $B_{zn}$ are on the same order, and $\omega_{0n}T_2 \gg 1$ if $\omega_0 > 1$ MHz, (11) can be further reduced to $$v_n(t) \approx M_{zn}^0 \omega_{0n}\sin\alpha e^{-t/T_2}[\mathcal{B}_{yn}\cos(\omega_{0n}t-\phi_n)+\mathcal{B}_{xn}\sin(\omega_{0n}t-\phi_n)] \quad (12)$$

Note that $v_n(t)$ is proportional $M_{zn}^0 \omega_{0n}$ or the square of the main magnetic field. Since $v_n(t)$ is also proportional to since a 90° pulse is widely used in most MRI techniques to obtain the strongest possible received signal. By this argument, the duration $\tau_e$ of excitation pulse is chosen to satisfy $\alpha=\pi/2$, namely, $$\gamma A_e \int_0^{\tau_e} \mathrm{sinc}\left[a\left(t-\frac{\tau_e}{2}\right)\right]dt = \frac{\pi}{2}$$

Typical value of $A_e$ is 50 mT when $B_0$ is 1.5 T.

Ideally, longer $\tau_f$ renders better MRI quality because more information is collected for image reconstruction. However, the received signal decays with time and tends to be corrupted by thermal noise intrinsic to the sample, hence a finite $\tau_f$ should be chosen pending on the SNR. From (12), the amplitude of FID signal decays at the temporal rate of $1/T_2$. An upper limit of $\tau_f$ is chosen such that the FID signal power (in dBm) is equal to the noise power (in dBm) plus a chosen parameter $A_0$ (in dB) at $t=\tau_f$, namely, $$A_0 = 20 \log_{10}\left(\frac{FID\ signal\ voltage}{noise\ voltage}\right) dB \quad (13)$$

Figure 4A:
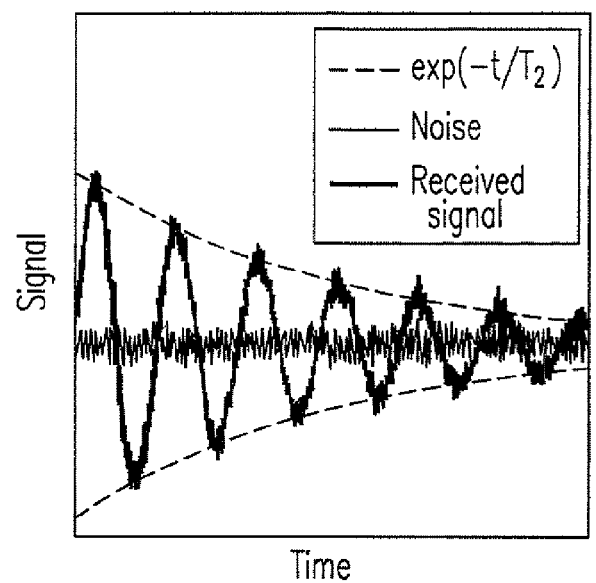
FIG. 4a shows the diagram of signal as a function of time.
Figure 4B:
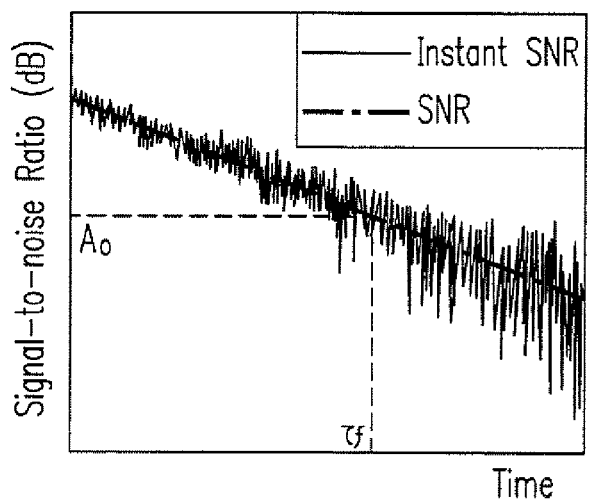
FIG. 4b shows the diagram of signal-to-noise ratio as a function of time.

FIG. 4a shows the diagram of signal variation with time and FIG. 4b shows the diagram of signal-to-noise ratio variation with time. These two Figures also show the scheme to determine the upper limit of $\tau_f$.

Generally, the spin-spin relaxation time $T_2$ of different tissues changes over a wide range from $T_{2,min}=43$ ms to $T_{2,max}=1500$ ms. The FID signal in (12) depends on $T_2$ which in turn depends on location $\bar{r}_n$ in the sample. The prestored FID signals $\{\bar{v}_n(t)\}$ and the measured FID signal $\bar{V}(t)$ may originate from different materials with different $T_2$. These two sets of FID signals can be compatible if $\tau_f$ is short enough so that their decays are approximately the same, namely, $$e-\tau_f/T_2, \min \approx e-\tau_f/T_2, \max$$

By simply letting $\tau_f=0.01\ T_{2,min}$, the maximum deviation between $e-\tau_f/T_2$,max and $e-\tau_f/T_2$,min is 0.97%. This condition dramatically reduces the measurement time $\tau_f$ compared with the Fourier-based MRI. The SNR might be decreased when shorter $\tau_f$ is chosen, and the SNR can be increased by repeating the measurement and taking their average value. In the following simulations, $\tau_f$ is chosen to be 1 ms, which is shorter than that determined with (13).

The noise in MRI is contributed by the sample itself the detecting coils, and measurement electronics. A large detecting coil can receive FID signals emitted from a large field of view (FOV), but the SNR is reduced due to long coil wire. Superconductor coil can be used to reduce thermal noise originating from the loop wire. Placing the detecting coil closer to the sample can increase the SNR. As revealed in (1), wider bandwidth of excitation field will decrease the SNR because the noise signal is proportional to the square root of bandwidth $\Delta f$. The SNR increases in proportion to the square root of the repeated number of measurements.

In the presence of noise, the MR signal in (5) becomes $$\tilde{V}(t) = \sum_{n=1}^{N} \mathcal{M}_n v_n(t) + \tilde{n}(t) \quad (14)$$

where $\tilde{V}(t)$ is the signal measured at the detecting coil when the sample is present, $v_n(t)$ is the FID signal of the nth voxel obtained using noise reduction technique to increase the SNR, for example, by averaging multiple measurement waveforms. The noise $\tilde{n}(t)$ is contributed by the sample and the circuits, the contribution from the latter can be neglected if $B_0$ is large enough.

The root-mean-square (RMS) value $\sigma_n$ of noise signal $\tilde{n}(t)$ is defined as $$\sigma_n^2 = \frac{1}{T}\int_{\tau_e}^{\tau_F} \tilde{n}^2(t)\,dt$$

where $T=\tau_f-\tau_e$. If measurements are conducted L times and taken average, the RMS noise $\sigma'_n$ becomes $$\sigma_{n'}^2 = \frac{1}{T}\int_{\tau_e}^{\tau_f} \left[\frac{1}{L}\sum_{k=1}^{L}\tilde{n}_k(t)\right]^2 dt \qquad (15)$$

$$= \frac{1}{L^2}\sum_{k=1}^{L}\frac{1}{T}\int_{\tau_e}^{\tau_f}\tilde{n}_k^2(t)dt +$$

$$\frac{2}{L^2}\sum_{k=1}^{L-1}\sum_{j=k+1}^{L}\frac{1}{T}\int_{\tau_e}^{\tau_f}\tilde{n}_j(t)\tilde{n}_k(t)dt$$

$$= \frac{\sigma_n^2}{L}$$

where the noise is assumed white and uncorrelated, namely, $$\frac{1}{T}\int_{\tau_e}^{\tau_f}\tilde{n}_j(t)\tilde{n}_k(t)dt = \sigma_n^2 \delta_{jk}$$

with $\delta_{jk}$ the Kronecker's delta function. In other words, the RMS noise can be reduced by a factor $\sqrt{L}$.

The RMS value $\sigma_{\tilde{v}}$ of the FID signal with noise as in (14) is calculated as $$\sigma_{\tilde{v}}^2 = \frac{1}{T}\int_{\tau_e}^{\tau_f}\tilde{v}^2(t)dt \qquad (16)$$

$$= \sigma_V^2 + \sigma_n^2 + 2\sum_{n=1}^{N}\mathcal{M}_n\frac{1}{T}\int_{\tau_e}^{\tau_f}v_n(t)\tilde{n}(t)dt$$

$$= \sigma_V^2 + \sigma_n^2$$

where the noise is assumed independent of the FID signal $v_n(t)$, $\sigma_V$ is the RMS value of FID signal without noise and can be calculated as $$\sigma_V^2 = \frac{1}{T}\int_{\tau_e}^{\tau_f}V^2(t)dt$$

$$= \frac{1}{T}\sum_{n=1}^{N}\sum_{l=1}^{N}\mathcal{M}_n\mathcal{M}_l\int_{\tau_e}^{\tau_f}v_n(t)v_l(t)dt$$

$$= \frac{1}{T}\sum_{n=1}^{N}\sum_{l=1}^{N}\mathcal{M}_n\mathcal{M}_l Z_{nl}$$

The SNR thus becomes $$SNR = \frac{\sigma_{\tilde{v}}}{\sigma_n} = \frac{\sqrt{\sigma_V^2 + \sigma_n^2}}{\sigma_n} \cong \frac{\sigma_V}{\sigma_n} + \frac{\sigma_n}{2\sigma_V} \qquad (17)$$

assuming $\sigma_v \gg \sigma_n$. If the SNR is set to $A_0$ as in (13), the RMS value of noise can be derived as $$\sigma_n = \sigma_v(10^{A_0/20} - \sqrt{10^{A_0/10} - 2})$$

The quality of reconstructed MRI can be evaluated by defining a percentage deviation as $$\varepsilon = \frac{\sqrt{\sum_{n=1}^{N}(M_n^O - M_n^R)^2}}{\sqrt{\sum_{n=1}^{N}(M_n^O)^2}} \times 100\% \qquad (18)$$

where $M_n^O$ and $M_n^R$ are the original and the reconstructed magnetization density, respectively, in voxel n.

Figure 5:
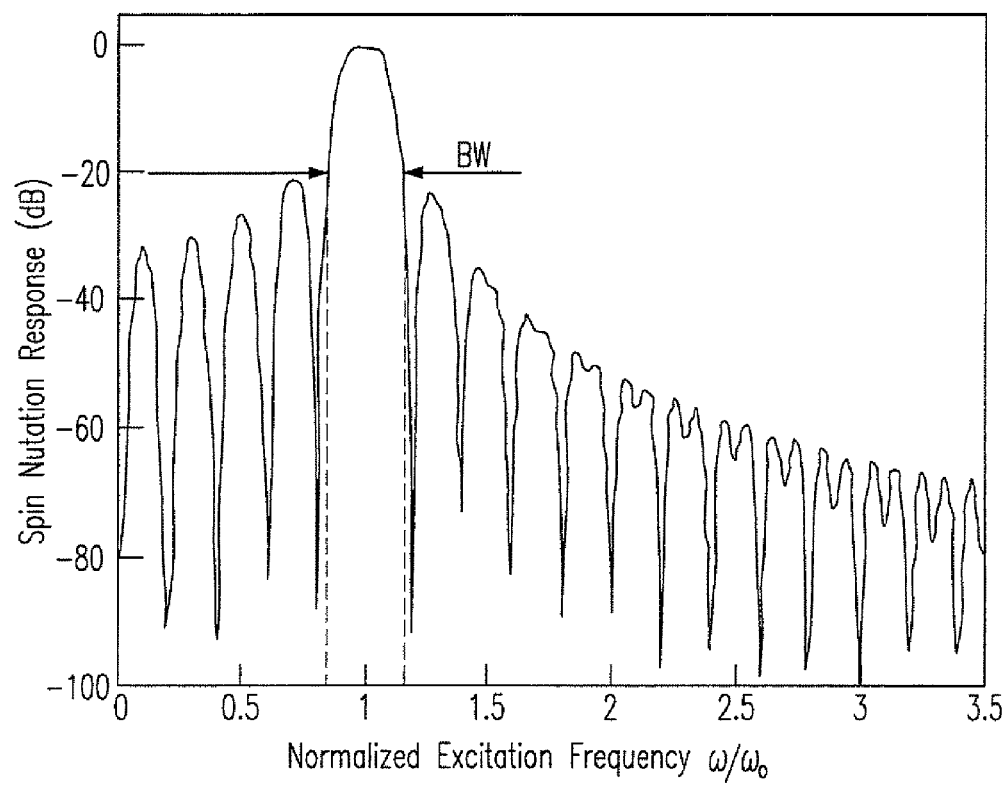
FIG. 5 shows the diagram of nutation response of spin.

When the carrier frequency ω of the excitation field is away from the Larmor frequency $\omega_{0n}$ of the magnetization density at voxel $\bar{r}_n$, the flip angle $\alpha_n$ of the subject voxel will be less than expected, which is known as the off-resonance phenomenon. The requirement on uniformity of main magnetic field is relatively loose compared with that in the Fourier-based MRI technique. FIG. 5 shows the nutation response of spin, which is defined as NRS=20 $\log_{10}\sin \alpha$. Note that the voxels with their Larmor frequency $\omega_0$ falls within 30% of the excitation frequency ω effectively contribute to the received FID signal, assuming that the FID signals larger than one tenth of the maximum FID signal (NRS=−20 dB) are detectable.

For comparison with conventional Fourier-based techniques, consider a sample which is scanned in $N_s$ slices, each slice is composed of $N_r$ rows by $N_c$ columns of voxels. In the proposed time-domain technique, the excitation field is applied only once to receive signals from $N_r$ $N_c$ resonant voxels in one slice, and only one gradient field is required. If no gradient field is imposed, signals from all the voxels in the sample will be received in one measurement. On the other hand, conventional Fourier-based techniques require changing of resonant frequency by the order of $N_r$ times to acquire the same slice image, and three orthogonal gradient fields are required.

Inhomogeneity of the main magnetic field may distort the shape of the resonant slice. This effect can be calibrated by identifying the resonant region and linking with the associated FID signals in that region. Similarly, inhomogeneity in the main magnetic field will affect the localization of voxel using the Fourier-based techniques, which can be calibrated in a similar manner.

The scan time for a slice composed of 512×300 voxels using conventional Fourier-based techniques is about 2-3 minutes. In the proposed time-domain technique, the scan time is only 1 ms for one slice. A longer measurement time can be allocated for one slice, during which repeated measurements can be conducted to increase the SNR. Filtering techniques can also be applied to the time-domain data to further increase the SNR.

By changing the operating frequency of the excitation field, one slice image can be obtained in one measurement without switching on/off of gradient fields as in Fourier-based techniques, thus circuitry complexity is reduced. If finer resolution or larger slice is requested, auxiliary detecting coils can be used to improve the condition of matrix Z.

By using the invention, three-dimensional MRI can be acquired with no gradient field, and two-dimensional MRI can be acquired with only one gradient field, compared with three orthogonal gradient fields required in conventional Fourier-based techniques. Data acquisition time for one slice of M is much shorter than that of Fourier-based techniques.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A method of time-domain magnetic resonance imaging, comprising:
   (a) providing a main magnetic field therein a sample is placed;
   (b) imposing an excitation field to excite the sample, and then immediately removing the excitation field to make the sample emit a free induction decay (FID) signal, wherein the time-domain signal is generated from a region having a plurality of voxels located in the sample;
   (c) receiving the FID signal, wherein the received FID signal is a time-domain signal and free from being Fourier transformed; and
   (d) processing, free from obtaining a signal localization for the sample, the time-domain signal free from Fourier transformation to derive a distribution of magnetization of the plurality of voxels for acquiring an image data.

2. A method as claimed in claim 1, wherein the step (d) further comprises a step (d1) of deriving a plurality of components of the time-domain signal respectively emitted by the plurality of voxels by treating the time-domain signal as a linear superposition of the plurality of components.

3. A method as claimed in claim 1, wherein the step (d) further comprises a step (d1) of deriving a plurality of components of the time-domain signal respectively emitted by the plurality of voxels with a solution to the Bloch equation.

4. A method as claimed in claim 1, wherein the step (d) further comprising a step (d1) of deriving a plurality of components of the time-domain signal respectively emitted by the plurality of voxels with a matrix operation.

5. A method as claimed in claim 1, wherein the step (a) further comprises a step (a1) of providing a gradient field in a direction being perpendicular to a direction of the excitation field and being the same as a direction of the main magnetic field.

6. A method as claimed in claim 1, wherein the image data is generated by processing the FID signal emitted once from the excited sample.

7. A method as claimed in claim 1 further comprising a step (e) of repeating the steps (b) and (c) to receive at least two FID signals for improving a signal-to-noise ratio (SNR) of the image data by averaging the at least two FID signals.

8. A method as claimed in claim 1, wherein the step (a) further comprises a step (a1) of providing an auxiliary detecting coil to improve resolution of the image data.

9. A method of time-domain magnetic resonance imaging, comprising:
   (a) providing a transient excitation to a sample to make the sample emit an emitting signal;
   (b) receiving the emitting signal, wherein the received emitting signal is a time-domain signal and free from being Fourier transformed; and
   (c) processing the time-domain signal free from Fourier transformation to derive a distribution of magnetization of the sample for acquiring an image data in a process free from obtaining a signal localization for the sample.

10. A method as claimed in claim 9, wherein the emitting signal is a free induction decay (FID) signal, the sample is placed in a main magnetic field, and the step (c) further comprises a step (c1) of deriving a plurality of components of the time-domain signal respectively emitted by a plurality of voxels in the sample to acquire the image data by a method selected from a group consisting of a solution to the Bloch equation, a matrix operation and by a treatment of the time-domain signal as a linear superposition of the plurality of components.

11. An imaging device, comprising:
    an excitation device transiently exciting a sample thereby emitting an emitting signal;
    a detecting coil receiving the emitting signal; and
    an operating circuit processing, free from obtaining a signal localization for the sample, the received emitting signal to derive a distribution of magnetization of the sample and generating an image of the sample,
    wherein the received emitting signal is a time-domain signal being processed to acquire an image data and free from Fourier transformation.

12. A device as claimed in claim 11, wherein the image has a plurality of pixels respectively emitted by the plurality of magnetization densities and the operating circuit is an application specific integrated circuit (ASIC).

13. A device as claimed in claim 11, wherein the sample has a region having a plurality of voxels, the excitation device transiently excites the region thereby emitting the emitting signal, the emitting signal is a free induction decay (FID) signal having a plurality of components respectively emitted by the plurality of voxels, the detecting coil receives the FID signal, the operating circuit is connected to the detecting coil, and the image represents a plurality of magnetization densities respectively emitting the plurality of components.

14. A device as claimed in claim 11 further comprising two main coils providing a magnetic field, wherein the detecting coil and the excitation coil are configured between the two main coils, the detecting coil is configured inside the excitation coil, each of the coils has an axial direction, the axial directions of the two main coils are the same and perpendicular to the axial direction of the excitation coil, and the axial direction of the detecting coil is the same as the axial direction of the excitation coil.

15. A device as claimed in claim 14 further comprising a gradient coil providing a gradient field and having an axial direction being the same as the axial direction of the main coil.

16. A device as claimed in claim 15 further comprising an auxiliary detecting coil to improve resolution of the image and having an axial direction being perpendicular to the axial direction of the detecting coil.

17. A device as claimed in claim 14, wherein the two main coils, the detecting coil, the excitation coil, the gradient coil and the auxiliary detecting coil are ones selected from a group consisting of a Golay coil, a Helmholtz coil and a solenoid coil, and are respectively made of a material selected from a group consisting of a conductive material, a semi-conductive material and a super-conductive material.

18. A device as claimed in claim 11, wherein the operating circuit derives the plurality of components with a solution to the Bloch equation.

* * * * *